US008044727B2

(12) United States Patent
Higashi

(10) Patent No.: US 8,044,727 B2

(45) Date of Patent: Oct. 25, 2011

(54) PHASED LOCKED LOOP CIRCUIT INCLUDING VOLTAGE CONTROLLED RING OSCILLATOR

(75) Inventor: Hirohito Higashi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 309 days.

(21) Appl. No.: 12/158,286

(22) PCT Filed: Dec. 20, 2005

(86) PCT No.: PCT/JP2005/023384

§ 371 (c)(1), (2), (4) Date: Jun. 19, 2008

(87) PCT Pub. No.: WO2007/072551

PCT Pub. Date: Jun. 28, 2007

(65) Prior Publication Data

US 2009/0167446 A1 Jul. 2, 2009

(51) Int. Cl.
*H03K 3/03* (2006.01)

(52) U.S. Cl. .................... 331/57; 331/36 C; 331/117 V; 331/179

(58) Field of Classification Search .................... 331/57, 331/177 V, 177 R, 36 C, 34, 179
See application file for complete search history.

(56) References Cited

U.S. PATENT DOCUMENTS

| | | | | |
|---|---|---|---|---|
| 5,420,547 | A | 5/1995 | Kikuchi | |
| 5,767,748 | A | 6/1998 | Nakao | |
| 6,252,467 | B1 | 6/2001 | Yoshimura | |
| 6,954,110 | B2 * | 10/2005 | Li | 331/57 |
| 7,057,466 | B2 * | 6/2006 | Chien | 331/57 |
| 7,061,334 | B1 * | 6/2006 | Baig et al. | 331/57 |
| 2004/0075505 | A1 * | 4/2004 | Yang et al. | 331/57 |

FOREIGN PATENT DOCUMENTS

| | | | |
|---|---|---|---|
| JP | 57-057642 | U | 4/1982 |
| JP | 64-022104 | A | 1/1989 |
| JP | 2-53304 | A | 2/1990 |
| JP | 04-011409 | A | 1/1992 |
| JP | 7-169583 | A | 7/1995 |
| JP | 7-169584 | A | 7/1995 |
| JP | 9-214299 | A | 8/1997 |
| JP | 9-326676 | A | 12/1997 |
| JP | 11-215024 | A | 8/1999 |
| JP | 2000-244285 | A | 9/2000 |
| JP | 2001-201392 | A | 7/2001 |
| JP | 3528203 | B | 5/2004 |

OTHER PUBLICATIONS

Japanese Office Action, Partial English-language translation, mailed Dec. 7, 2010 for corresponding Japanese Application No. 2007-550956.

PCT Notification dated Jul. 3, 2008 and an English-language translation of a Written Opinion dated Dec. 20, 2005, previously submitted without English translation on Jun. 19, 2008.

* cited by examiner

*Primary Examiner* — Ryan Johnson
*Assistant Examiner* — Robert Pascal
(74) *Attorney, Agent, or Firm* — Fujitsu Patent Center

(57) ABSTRACT

There is provided a voltage controlled ring oscillator having a plurality of ring-connected amplifiers (401), and a plurality of variable capacitance elements (502*a*, 502*b*) being respectively connected to the plurality of amplifiers and having capacitances varied by a voltage control. A plurality of load resistors (402) and a plurality of tail current sources (403) are respectively connected to the plurality of amplifiers.

16 Claims, 13 Drawing Sheets

F I G. 1
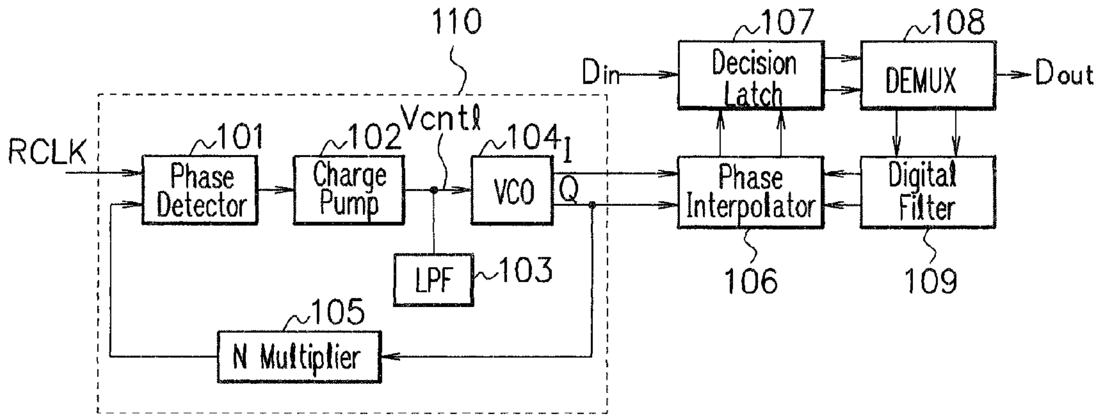
F I G. 2
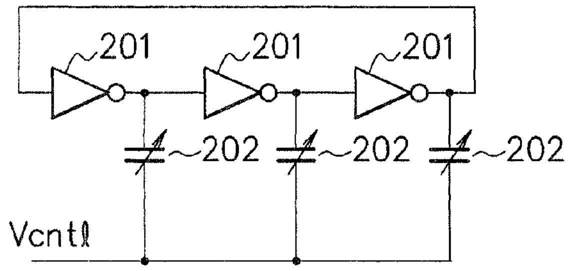
F I G. 3
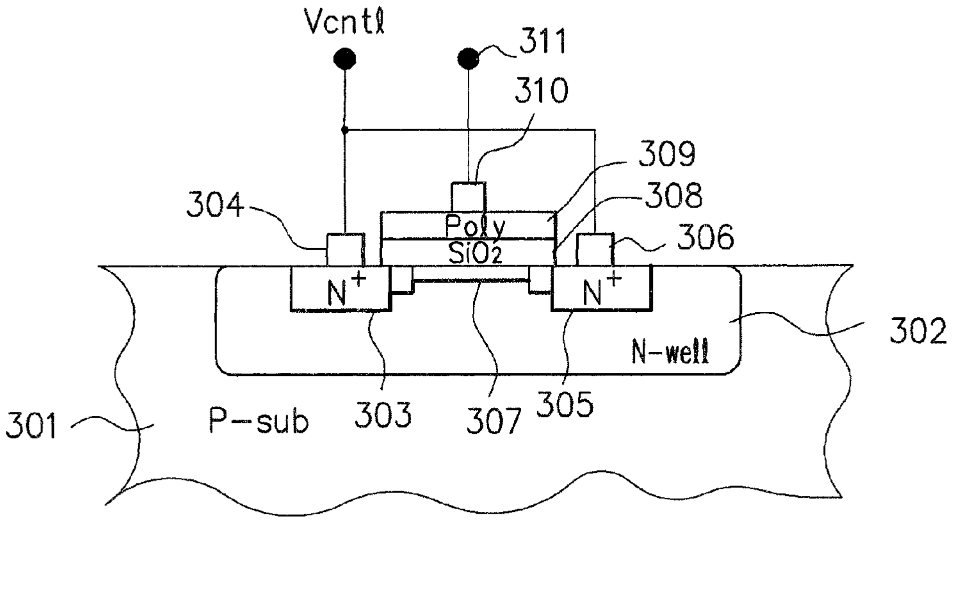

F I G. 4
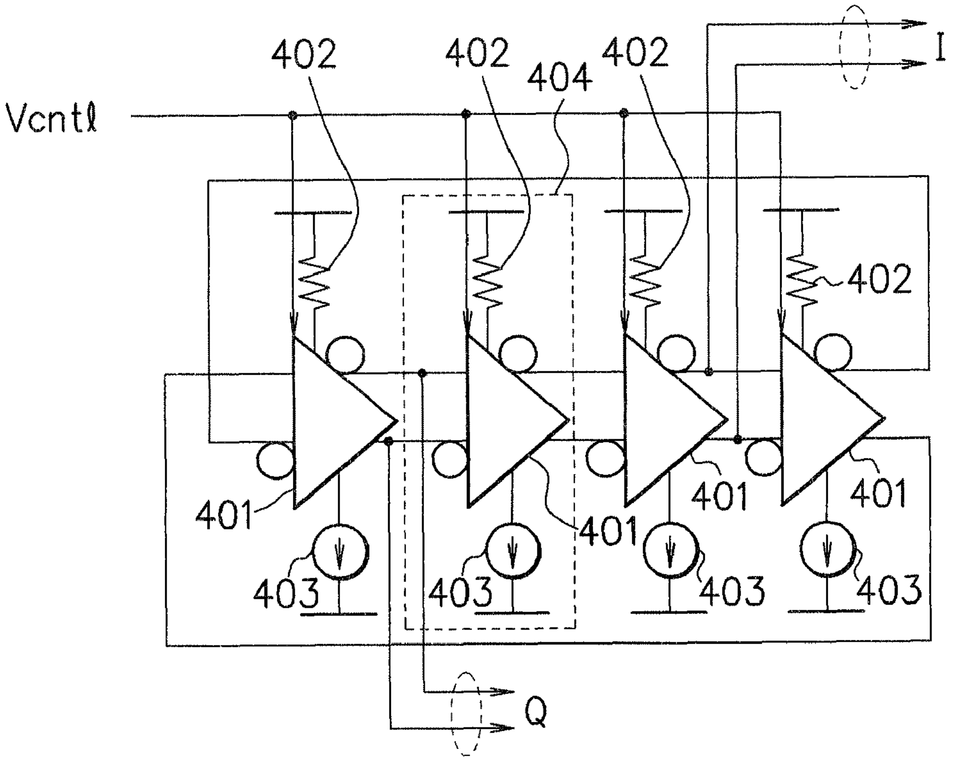
F I G. 5
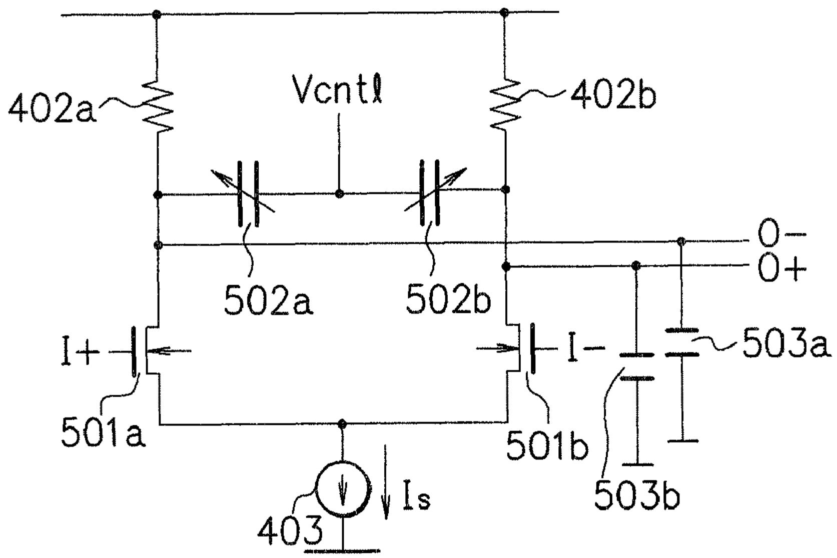

F I G. 8A
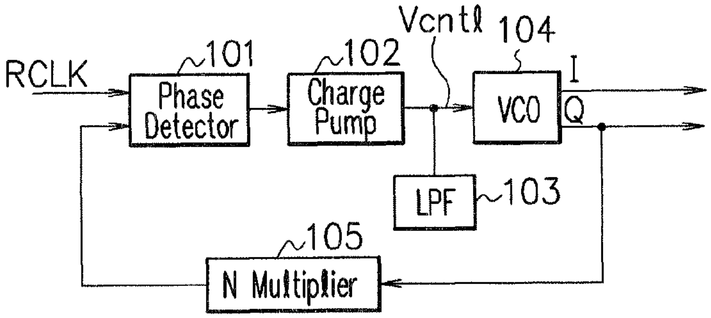
F I G. 8B
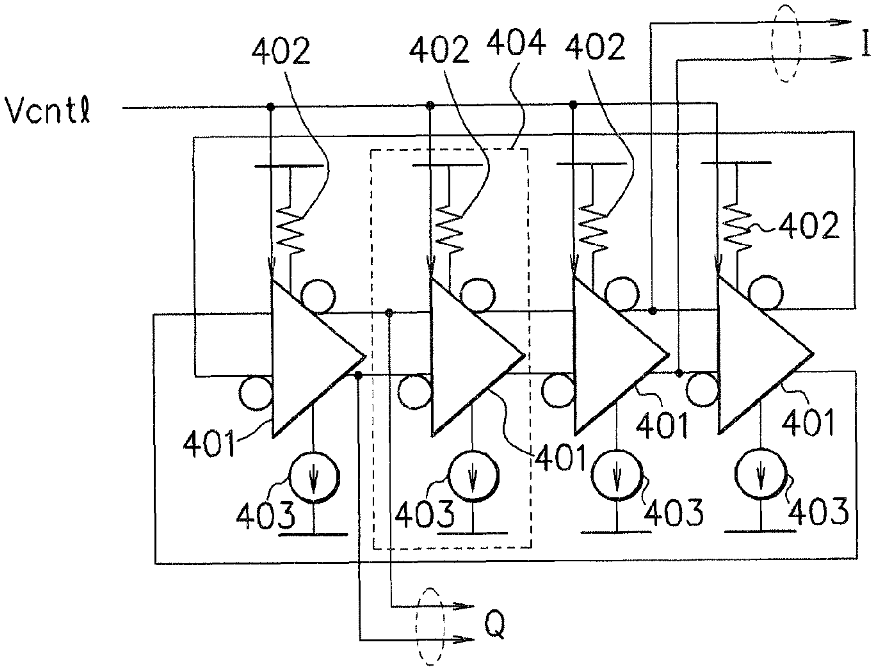
F I G. 8C
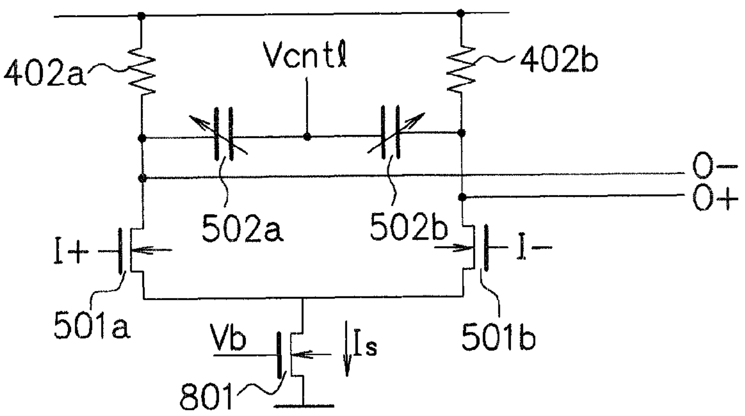

F I G. 9A
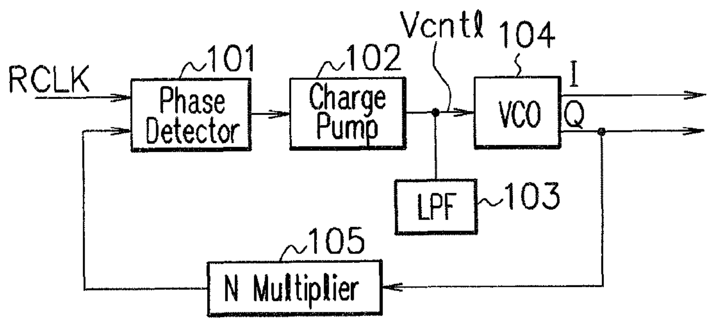
F I G. 9B
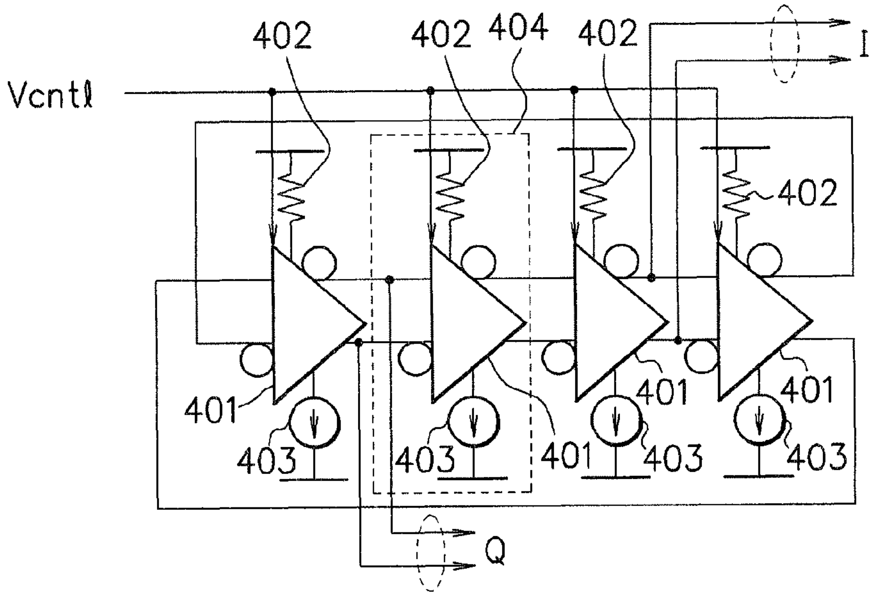
F I G. 9C
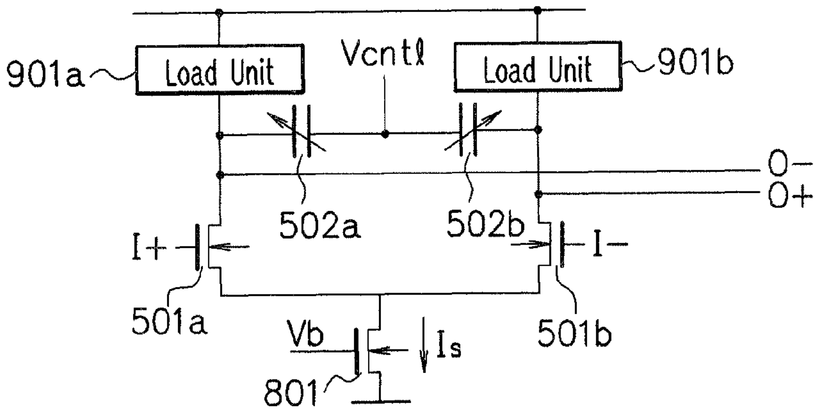

F I G. 9D
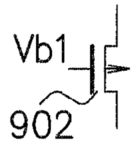
F I G. 9E
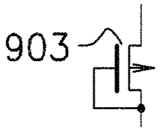
F I G. 9F
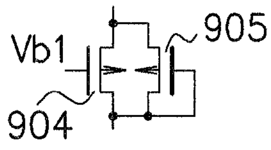
F I G. 10A
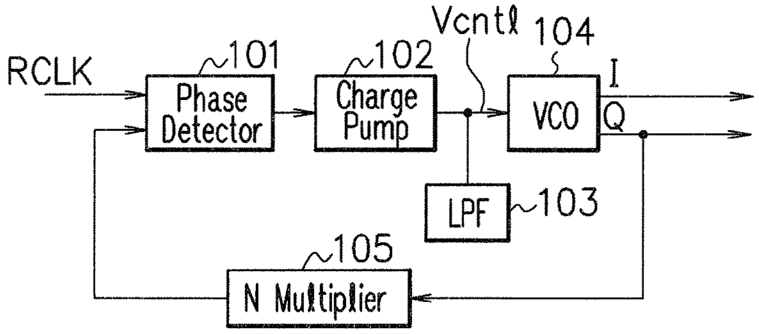

F I G. 10B
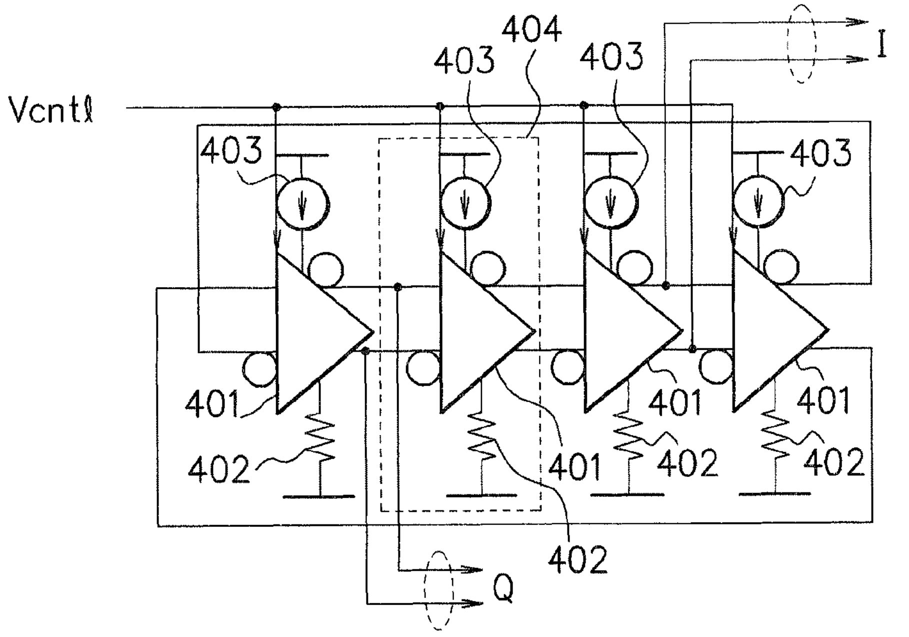
F I G. 10C
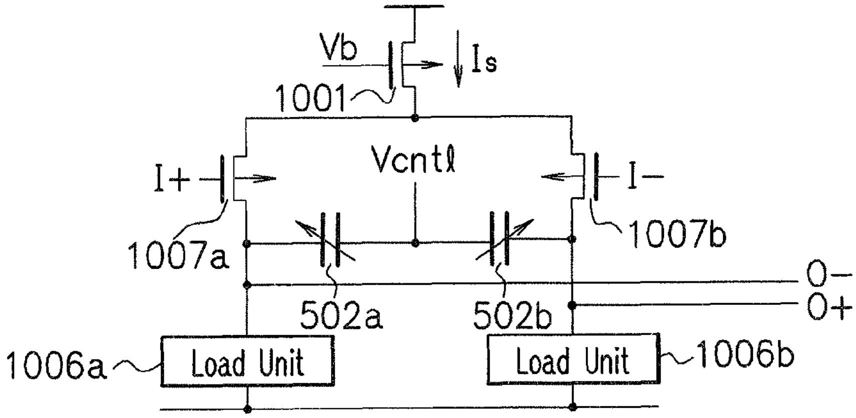
F I G. 10D
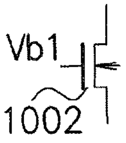

F I G. 11B
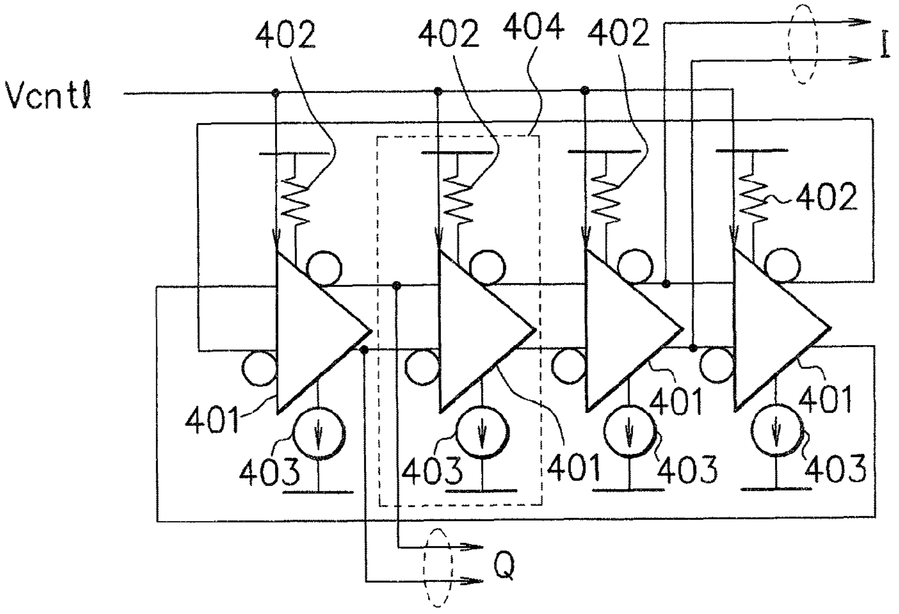
F I G. 11C
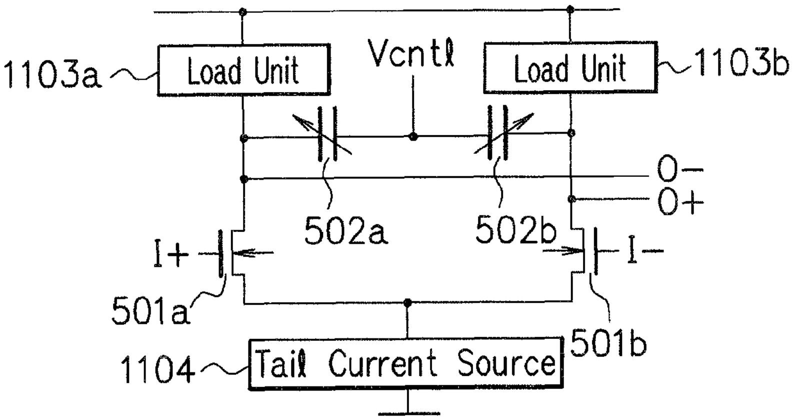
F I G. 11D
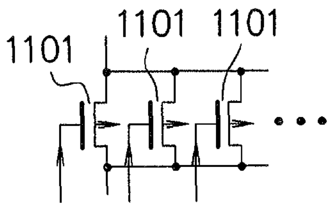

F I G. 11E
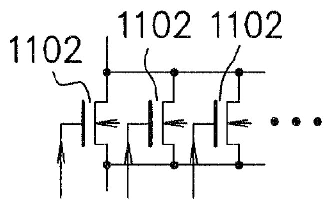
F I G. 12A
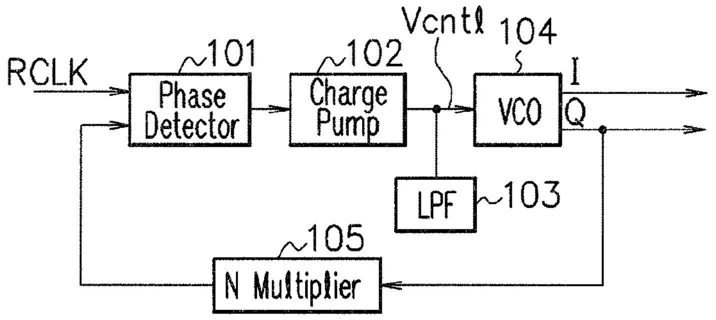
F I G. 12B
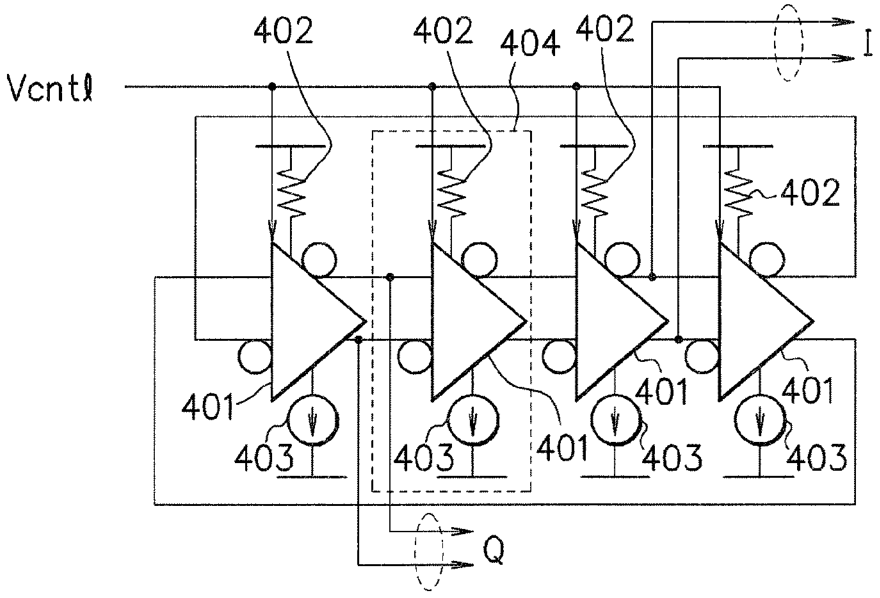

F I G. 12C
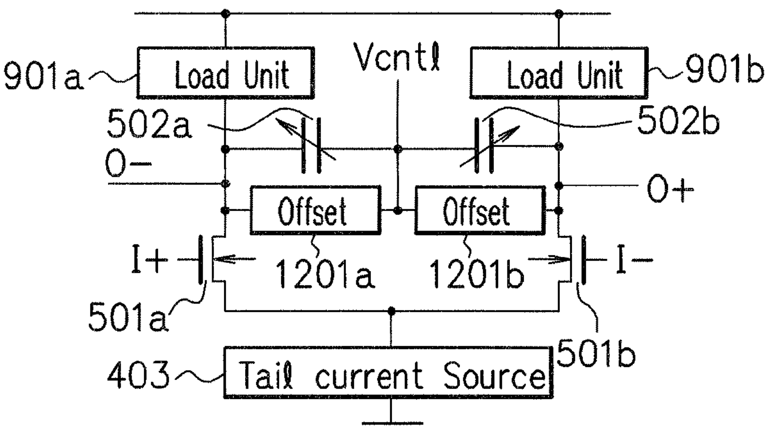
F I G. 12D
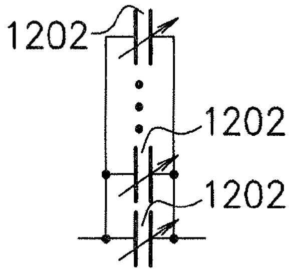
F I G. 12E
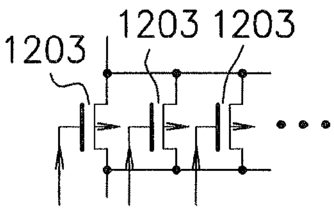

F I G. 13
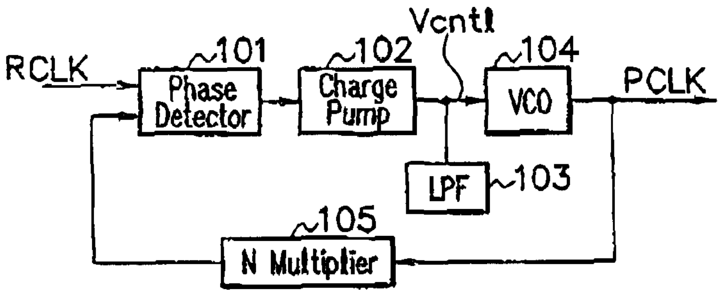

PHASED LOCKED LOOP CIRCUIT INCLUDING VOLTAGE CONTROLLED RING OSCILLATOR

CROSS-REFERENCE TO RELATED APPLICATION

This is a National Stage entry of International Application No. PCT/JP2005/023384, filed Dec. 20, 2005. The disclosure of the prior application is hereby incorporated herein in its entirety by reference.

TECHNICAL FIELD

The present invention relates to a voltage controlled ring oscillator.

BACKGROUND ART

FIG. 14A is a view showing a structural example of a voltage controlled ring oscillator. The voltage controlled ring oscillator is a Voltage Controlled Oscillator (VCO). A plurality of differential amplifiers 1401 are ring-connected. A plurality of variable resistors 1402 are respectively connected to the plurality of differential amplifiers 1401. A plurality of current sources 1403 are respectively connected to the plurality of differential amplifiers 1401. A CR ring element 1404 has each one of the differential amplifier 1401, the variable resistor 1402, and the current source 1403. Four of the CR ring elements 1404 are ring-connected, for instance.

FIG. 14B is a circuit diagram showing a structural example of the CR ring element 1404 in FIG. 14A. The CR ring element 1404 has a bias unit 1431 and an oscillating unit 1432. Hereinafter, an MOS field-effect transistor is simply referred to as a transistor. The bias unit 1431 has a P-channel transistor 1411 and an N-channel transistor 1412.

The oscillating unit 1432 inputs differential signals from a non-inverting input terminal I+ and an inverting input terminal I− to amplify them, and outputs the amplified differential signals from a non-inverting output terminal O+ and an inverting output terminal O−. The differential signals are two signals whose phases are mutually inverted by 180°. The N-channel transistor 1422 corresponds to the current source 1403 in FIG. 14A, and constitutes a current mirror circuit with the transistor 1412. When a current Il flows through the transistor 1412, a current Is flows through the transistor 1422. To the non-inverting output terminal O+ and the inverting output terminal O−, a parasitic capacitance 1425*b* and a parasitic capacitance 1425*a* are respectively connected. The non-inverting input terminal I+ is connected to a gate of an N-channel transistor 1421*a*, and the inverting input terminal I− is connected to a gate of an N-channel transistor 1421*b*. P-channel transistors 1424*a* and 1423*a* are connected to the transistor 1421*a*, and constitute a load resistor. P-channel transistors 1424*b* and 1423*b* are connected to the transistor 1421*b*, and constitute a load resistor. The transistors 1423*a* and 1423*b* are variable resistors controlled by a voltage Vcntl. In the CR ring element 1404, a delay amount of the output signal is determined by a CR, that is, a capacitance and a resistor. By varying the variable resistors 1423*a* and 1423*b* with the voltage Vcntl, an oscillation frequency of the ring oscillator can be controlled.

As described above, the voltage controlled ring oscillator is composed of the oscillating unit 1432 which applies positive feedback by connecting a plurality of stages of Current Mode Logic (CML)-type ring elements (CR delay elements), and the bias unit 1431 which supplies a bias voltage to the ring elements. The control voltage Vcntl is input into the bias unit 1431, and the bias unit 1431 outputs the bias voltage which is in proportion to the voltage Vcntl. The bias voltage controls a tail current source 1422 and the transistors 1423*a* and 1423*b* being the load resistors in a CML circuit. There is a method for controlling only either the load resistors 1423*a* and 1423*b* or the tail current source 1422, but, in order to make an amplitude constant without depending on the oscillation frequency, a method for controlling both of them is commonly adopted.

FIG. 15 is a graph showing a relation between the control voltage Vcntl and the oscillation frequency fosc. Since the control voltage Vcntl is controlled after passing through one stage of the transistor 1411 in the bias unit 1431, it is affected by a threshold voltage Vth of the transistor. The transistor 1411 is connected at a source thereof to a power supply voltage Vdd, and connected at a drain thereof to a gate of the transistor 1422. In the ring oscillator, there is a problem that the threshold voltage Vth becomes a hindrance for obtaining a tuning range, so that the tuning range has to be secured with the voltage in which the threshold voltage Vth is subtracted from the power supply voltage Vdd. The tuning range of the control voltage Vcntl required to realize a target oscillation frequency 1501 which meets the specifications, is a tuning range 1502. Depending on a process variation and the like, a characteristic varies between a characteristic FAST and a characteristic SLOW. A characteristic TYP is a typical characteristic when the threshold voltage Vth takes a typical value. The characteristic FAST is a characteristic when the threshold voltage Vth varies at low frequencies. The characteristic SLOW is a characteristic when the threshold voltage Vth varies at high frequencies. The ring oscillator is affected largely by the process variation.

When trying to secure the target tuning range 1502 by including the process variation and variations of the power supply voltage Vdd, a temperature, and the like, the minimum of the characteristic is determined at the characteristic SLOW with the narrowest band, which consequently brings about a problem that a gain of the VCO becomes very high at the characteristic TYP. The gain of the VCO corresponds to an inclination of the characteristic. When the gain of the VCO is increased, the VCO itself becomes highly sensitive, so that it is forced to respond sensitively to the power supply voltage variation and the variation of the control voltage Vcntl. This leads to generate a jitter, which deteriorates the performance of a PLL (Phase Locked Loop) circuit when the VCO is applied thereto.

Further, along with the advance in technology, a voltage scaling (lowering the voltage) is in progress. In the ring oscillator, the voltage scaling is a big problem. While the power supply voltage is scaled, the threshold voltage Vth of the transistor is not scaled, so that the value Vdd-Vth being the tuning range 1502 becomes smaller. When a circuit is composed using a voltage of 1V or lower in the future, the tuning range 1502 cannot be secured by an existing circuit system, which can be easily predicted.

As described above, since the tuning range 1502 is determined by a value Vdd-Vth, the existing ring oscillator has dealt with it by increasing the gain of the VCO. However, to increase the gain of the VCO means to simultaneously increase a noise (jitter), and it also suggests that the design becomes further difficult to cope with the power supply voltage scaling in the future.

Further, an electrostatic capacitance type weight sensor is known wherein the sensor has a variable capacitor formed of a fixed electrode and a movable electrode in which a capacitor having a predetermined electrostatic capacitance is inserted between a fixing metal frame and the fixed electrode, to thereby largely reduce a variation of oscillation frequency offset values and the sensitivity variation caused by a stray capacitance depending on an environmental change and a change with time.

Further, a self-excited oscillation circuit is known wherein the oscillation circuit has a CR oscillating unit in which a variable capacitance diode is used.

Furthermore, a ring oscillator is known in which a plurality of differential gain stages are connected in a ring shape via resistor elements, and a band-pass filter is respectively connected between each of inputs of the differential gain stages and a reference potential.

SUMMARY

According to one aspect of the present invention, there is provided a voltage controlled ring oscillator having a plurality of ring-connected amplifiers and a plurality of variable capacitance elements being respectively connected to the plurality of amplifiers and having capacitances varied by a voltage control.

BRIEF DESCRIPTION OF THE DRAWINGS

FIG. 1 is a view showing a structural example of a high speed input/output (I/O) circuit according to a first embodiment of the present invention;

FIG. 2 is a circuit diagram showing a structural example of a VCO in FIG. 13;

FIG. 3 is a sectional view of a semiconductor chip showing a structural example of a variable capacitance in FIG. 5;

FIG. 4 is a circuit diagram showing a structural example of a VCO in FIG. 1;

FIG. 5 is a circuit diagram showing a structural example of a CR ring element in FIG. 4;

FIG. 8A is a block diagram showing a structural example of a PLL circuit according to a second embodiment of the present invention;

FIG. 8B is a circuit diagram showing a structural example of a VCO in FIG. 8A;

FIG. 8C is a circuit diagram showing a structural example of a CR ring element in FIG. 8B;

FIG. 9A is a block diagram showing a structural example of a PLL circuit according to a third embodiment of the present invention;

FIG. 9B is a circuit diagram showing a structural example of a VCO in FIG. 9A;

FIG. 9C is a circuit diagram showing a structural example of a CR ring element in FIG. 9B;

FIG. 9D is a view showing a structural example of a load resistor unit in FIG. 9C;

FIG. 9E is a view showing another structural example of the load resistor unit in FIG. 9C;

FIG. 9F is a view showing still another structural example of the load resistor unit in FIG. 9C;

FIG. 10A is a block diagram showing a structural example of a PLL circuit according to a fourth embodiment of the present invention;

FIG. 10B is a circuit diagram showing a structural example of a VCO in FIG. 10A;

FIG. 10C is a circuit diagram showing a structural example of a CR ring element in FIG. 10B;

FIG. 10D is a view showing a structural example of a load resistor unit in FIG. 10C;

FIG. 11B is a circuit diagram showing a structural example of a VCO in FIG. 11A;

FIG. 11C is a circuit diagram showing a structural example of a CR ring element in FIG. 11B;

FIG. 11D is a view showing a structural example of a load resistor unit in FIG. 11C;

FIG. 11E is a view showing a structural example of a tail current source in FIG. 11C;

FIG. 12A is a block diagram showing a structural example of a PLL circuit according to a sixth embodiment of the present invention;

FIG. 12B is a circuit diagram showing a structural example of a VCO in FIG. 12A;

FIG. 12C is a circuit diagram showing a structural example of a CR ring element in FIG. 12B;

FIG. 12D is a view showing a structural example of an offset capacitance in FIG. 12C;

FIG. 12E is a view showing another structural example of the offset capacitance in FIG. 12C;

FIG. 13 is a block diagram showing a structural example of a PLL circuit according to a seventh embodiment of the present invention;

DETAILED DESCRIPTION OF THE PREFERRED EMBODIMENTS

Figure 6:
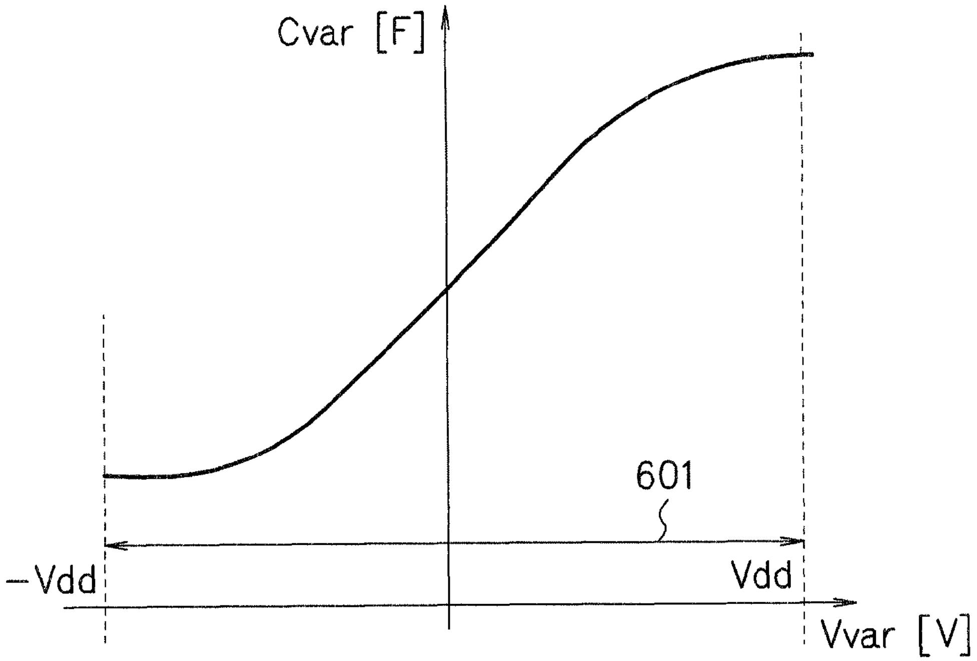
FIG. 6 is a graph showing a relation between a both-end voltage Vvar and a capacitance Cvar of a variable capacitance.

FIG. 1 is a view showing a structural example of a high speed input/output (I/O) circuit according to a first embodiment of the present invention. In case of the high speed I/O circuit, a frequency clock being half of the data rate is required from a driver (Tx) and a receiver (Rx), in which the clock is generated by a PLL circuit 110. The PLL circuit 110 has a phase detector 101, a charge pump 102, a loop filter (LPF) 103, a voltage controlled oscillator (VCO) 104, and a multiplier 105. The phase detector 101 compares a reference clock RCLK with an output clock (feedback clock) output from the multiplier 105, and then outputs a pulse width corresponding to the phase error to the charge pump 102. The charge pump 102 flows a current corresponding to the pulse width through the LPF 103. The LPF 103 is a low-pass filter which smoothes the error signal. The VCO 104 oscillates in accordance with the smoothed voltage Vcntl, and outputs I signals and Q signals. For instance, the I signals are differential signals of 0° and 180°, and the Q signals are differential signals of 90° and 270°. The multiplier 105 outputs a signal in which a frequency of one signal output from the VCO 104 is multiplied by N to the phase detector 101. As a result, when the phase error detected by the phase detector 101 becomes 0, the PLL circuit 110 shifts to a locked state (stationary state), which enables to obtain a stable synchronous clock (I signals and Q signals) in which the frequency of the reference clock RCLK is multiplied by N.

A phase interpolator 106 mixes output signals from the VCO 104 and a digital filter 109, and outputs to a decision latch 107. The decision latch 107 latches serial-format data Din, and outputs it to a demultiplexer 108. The demultiplexer 108 converts the data from serial format to parallel format, to thereby output data Dout. The digital filter 109 filters the output data of the demultiplexer 108, and outputs to the phase interpolator 106. Accordingly, the latch timing of the decision latch 107 can be adjusted to be an appropriate timing in which the data Din is stable.

For the VCO 104 applied to the high speed I/O circuit, an LC-type VCO using an LC resonance or a voltage controlled ring oscillator applying positive feedback to differential CML-type amplifiers is used. Especially, in a PLL circuit which is not intended to be used at RF band (several GHz over), or which is intended to reduce the cost by using none of the specific elements such as an inductor, the voltage controlled ring oscillator is used.

Further, along with an advance in technology in recent years, the movement toward lowering the voltage is in progress. Although a digital circuit has a margin in low voltage specifications since a circuit operation thereof is determined by a logical threshold value, this voltage scaling occurs various troubles in an analog circuit. An applicable range of the present invention includes the high speed I/O circuit, the VCO 104 used for low voltage specifications, the PLL circuit 110 using the VCO 104, and the like.

FIG. 4 is a circuit diagram showing a structural example of the VCO 104 in FIG. 1. This VCO 104 is a voltage controlled ring oscillator. A plurality of differential amplifiers 401 are ring-connected. A plurality of load resistors 402 are fixed resistors respectively connected to the plurality of differential amplifiers 401. A plurality of current sources 403 are constant current sources respectively connected to the plurality of differential amplifiers 401. A CR ring element 404 has each one of the differential amplifier 401, the load resistor 402, and the current source 403. Four of the CR ring elements 404 are ring-connected, for instance. The differential amplifier 401 inputs differential signals, amplifies them and outputs. The differential signals are two signals whose phases are mutually inverted by 180°. Output differential signals of the respective differential amplifiers 401 have phase differences in which one period is divided by the number of differential amplifiers 401. For instance, the second differential amplifier 401 from the right outputs the differential signals of 0° and 180° as an I signal. The differential amplifier 401 on the far left outputs the differential signals of 90° and 270° as a Q signal. The differential amplifier 401 has a variable capacitance which is controlled by the control voltage Vcntl.

FIG. 5 is a circuit diagram showing a structural example of the CR ring element 404 in FIG. 4. The CR ring element 404 has a CML-type differential amplifier in which the differential signals are input from a non-inverting input terminal I+ and an inverting input terminal I−, and after being amplified, the differential signals are output from a non-inverting output terminal O+ and an inverting output terminal O−. A constant current Is is flown through the current source 403. To the non-inverting output terminal O+ and the inverting output terminal O−, a parasitic capacitance 503*b* and a parasitic capacitance 503*a* are respectively connected. The non-inverting input terminal I+ is connected to a gate of an N-channel transistor 501*a*, and the inverting input terminal I− is connected to a gate of an N-channel transistor 501*b*. The inverting output terminal O− is connected to a drain of the transistor 501*a*. The non-inverting output terminal O+ is connected to a drain of the transistor 501*b*. The current source 403 is connected between an interconnection point of sources of the transistors 501*a* and 501*b* and a ground. A load resistor 402*a* is connected between the drain of the transistor 501*a* and a power supply voltage. A load resistor 402*b* is connected between the drain of the transistor 501*b* and the power supply voltage. A variable capacitance 502*a* is connected between the drain of the transistor 501*a* and the control voltage Vcntl. A variable capacitance 502*b* is connected between the drain of the transistor 501*b* and the control voltage Vcntl. The variable capacitances 502*a* and 502*b* are on-chip varactors (varicaps). In the CR ring element 404, a delay amount of the output signal is determined by a CR, that is, a capacitance and a resistor. By varying the variable capacitances 502*a* and 502*b* with the voltage Vcntl, an oscillation frequency of the ring oscillator can be controlled.

FIG. 3 is a sectional view of a semiconductor chip showing a structural example of the respective variable capacitances 502*a* and 502*b* in FIG. 5. The variable capacitances 502*a* and 502*b* are formed on the semiconductor chip. A basic structure of the variable capacitances 502*a* and 502*b* is based on a structure of a transistor. A P-type semiconductor substrate 301 is a silicon substrate, for instance. An N-type well 302 is formed on the P-type substrate 301. $N^+$-type regions 303 and 305 correspond to a source and a drain of a transistor, and are formed on a surface of the N-type well 302 by ion injection. A region 307 corresponds to a channel region of the transistor, and is formed on the surface of the N-type well 302 by ion injection. A dielectric layer 308 corresponds to a gate oxide film of the transistor, and is formed on the region 307 using a silicon oxide film. A polysilicon 309 is formed on the dielectric layer 308. A contact portion 310 is formed on the polysilicon 309, and is connected to a terminal 311. The terminal 311 is connected to the drain of either the transistor 501*a* or the transistor 501*b*. A contact portion 304 is formed on the $N^+$-type region 303. A contact portion 306 is formed on the $N^+$-type region 305. The contact portions 304 and 306 are connected to the control voltage Vcntl.

Figure 15:
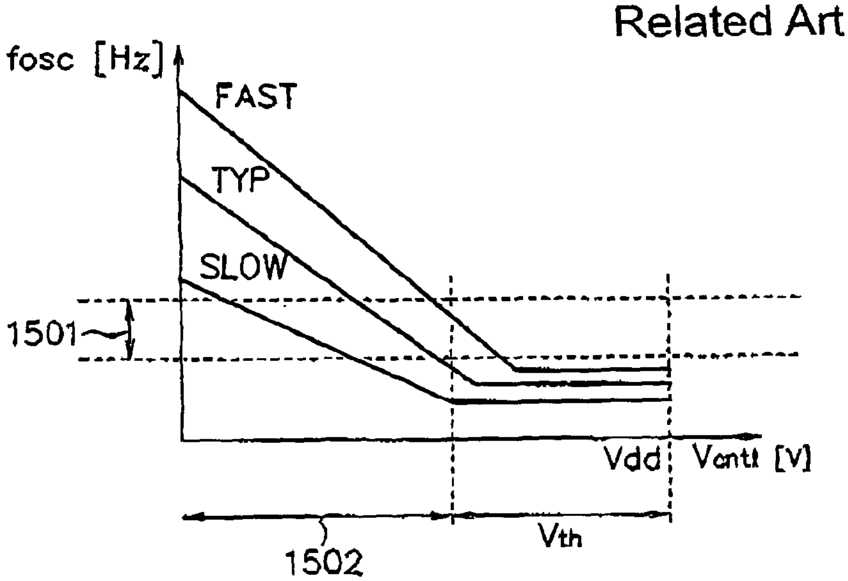
FIG. 15 is a graph showing a relation between a control voltage Vcntl and an oscillation frequency fosc.

FIG. 6 is a graph showing a relation between both-end voltages Vvar and capacitances Cvar of the variable capacitances 502*a* and 502*b* in FIG. 5. The capacitance Cvar can be controlled by varying the both-end voltage Vvar. The both-end voltage Vvar can take a range 601 from the power supply voltage Vdd to −Vdd as a tuning range. The both-end voltage Vvar can be controlled by the control voltage Vcntl, so that it is never adversely affected by a threshold voltage Vth as shown in FIG. 15.

Figure 7:
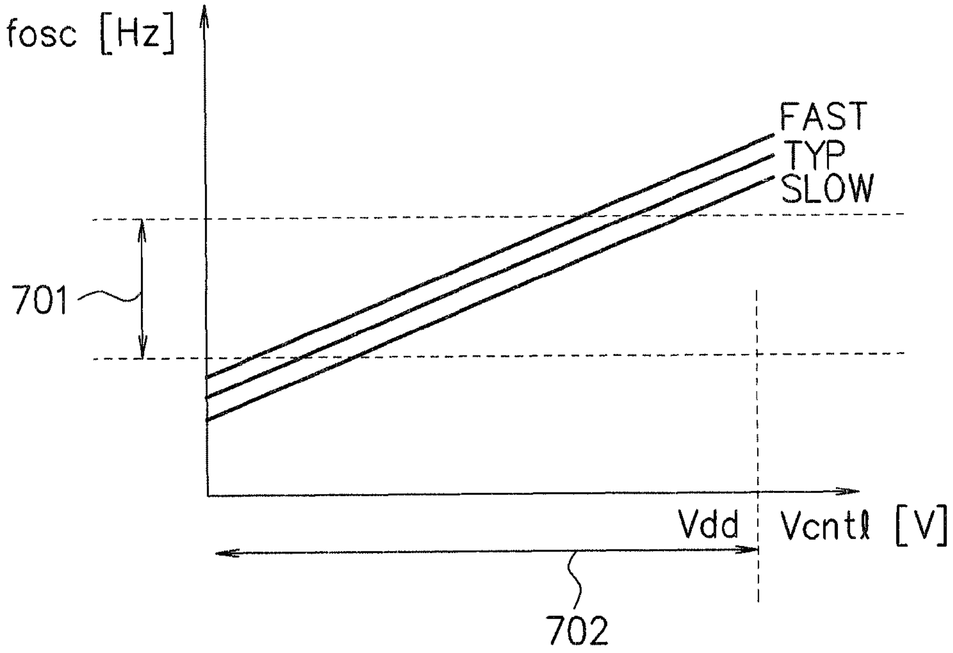
FIG. 7 is a graph showing a relation between a control voltage Vcntl and an oscillation frequency fosc.

FIG. 7 is a graph showing a relation between the control voltage Vcntl and an oscillation frequency fosc. Depending on a process variation and the like, a characteristic varies between a characteristic FAST and a characteristic SLOW. A characteristic TYP is a characteristic when the threshold voltage Vth takes a typical value. The characteristic FAST is a characteristic when the threshold voltage Vth varies at low frequencies. The characteristic SLOW is a characteristic when the threshold voltage Vth varies at high frequencies. In order to realize a target oscillation frequency 701 which meets the specifications, a wide range 702 can be used as a tuning range of the control voltage Vcntl.

Figure 14A:
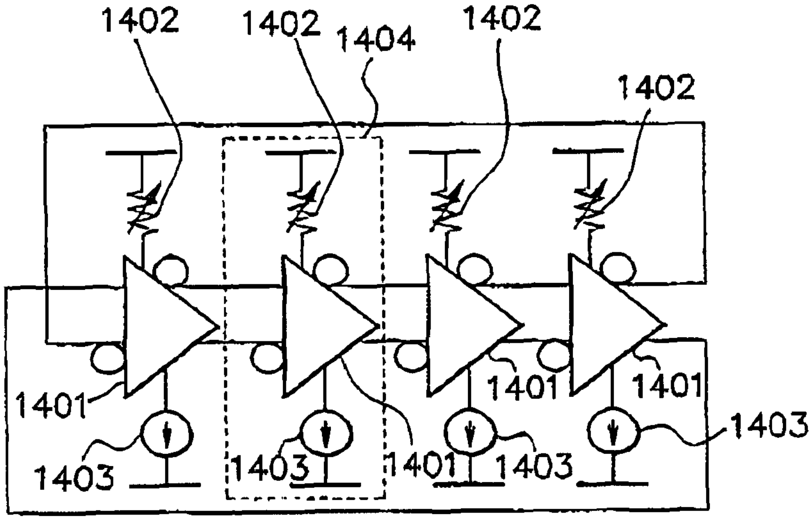
FIG. 14A is a view showing a structural example of a voltage controlled ring oscillator.

While the R (resistor) 1402 of the CR ring element 1404 is variable in an analog way in FIG. 14A, Cs (capacitances) 502*a* and 502*b* of the CR ring element 404 are variable in an analog way in the present embodiment. The one realizing the variable capacitances 502*a* and 502*b* is an on-chip varactor (varicap) having a structure shown in FIG. 3. According to the varactor with this structure, when the voltages Vvar at both ends of the varactor are variable, it becomes possible that the capacitance Cvar of the varactor itself takes a wide range of variation, as shown in FIG. 6. A C-V (capacitance-voltage) characteristic of the varactor is expressed by a stable first-order straight line which is in proportion to the voltage Vvar. Normally, it is ideal that the gain of the VCO is expressed by a linear form, but, when assuming the state where the PLL circuit is locked, the gain is not necessarily expressed by a perfect linear form. As described above, what becomes important in the PLL circuit are mutually different factors, which are, to take the tuning range 702 at the maximum and to suppress the gain of the VCO. As a supplemental explanation, since even the ring oscillator in FIG. 14A is influenced by a nonlinearity of the transistor, the characteristic thereof is not expressed by a first-order straight line perfectly. What is important in the characteristic of the varactor is that there is no influence of the threshold voltage Vth.

As described above, by fixing the resistors (R) 402*a* and 402*b* and varying the capacitances (C) 502*a* and 502*b* of the CR ring (delay) element 404, the range of the oscillation frequency fosc of the VCO 104 can be varied in proportion to the control voltage Vcntl output from the LPF 103 without being affected by the threshold voltage Vth. In the circuit in FIG. 14B, a control is conducted via the bias unit 1431 which is generally composed of a current mirror circuit. The current mirror circuit is sensitive to the process variation, the power supply voltage variation, or the temperature variation, so that a significant difference of the gain of the VCO is inevitably produced. The varactors 502*a* and 502*b* of the present embodiment have merits in that they are quite strong against these characteristics. Further, in the current mirror circuit, an accuracy of copy is worsened as the voltage is lowered, but, in the present embodiment, even being scaled to lower voltages, all the ranges that the power supply voltage takes can be used as a tuning range. Further, the tuning range calculated based on variable ranges of the varactors 502*a* and 502*b* can be easily calculated by manipulating the number of varactors 502*a* and 502*b* being lined in parallel, which provides a merit such that the required tuning range can be covered by a minimum gain of the VCO. As a result, a lower gain of the VCO can be achieved, and a PLL circuit with smaller jitter can be structured, as compared to the circuit in FIG. 14B.

Figure 14B:
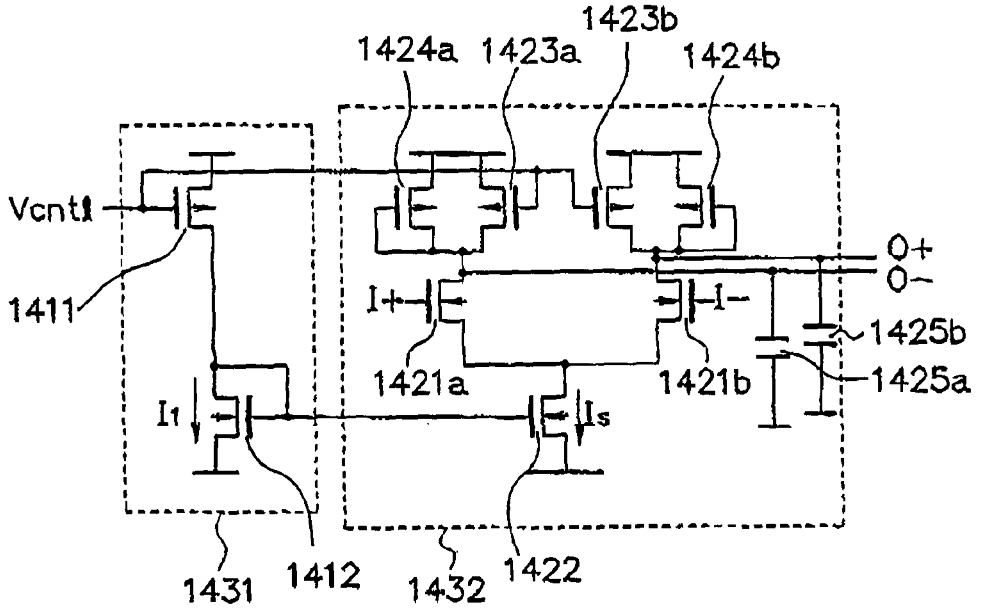
FIG. 14B is a circuit diagram showing a structural example of a CR ring element in FIG. 14A.

Since the varactors 502*a* and 502*b* can be directly controlled by the control voltage Vcntl, there is no need to provide the bias unit 1431 in FIG. 14B, which is another characteristic of the present embodiment. Since the bias unit 1431 being composed of the current mirror circuit enlarges a resistor Rds between the drain and the source of the transistor 1412, the transistor 1412 with long gate length and large gate width is applied. Therefore, to eliminate the bias unit 1431 provides a large effect in reduction of an area being used.

As described above, according to the present embodiment, in the voltage controlled ring oscillator which generates oscillation by applying positive feedback to the amplifiers, the tuning voltage range of the VCO can be enlarged into a wide range without being affected by the threshold voltage Vth, by controlling the voltage in an analog way in the on-chip varactor elements 502*a* and 502*b*.

FIG. 8A is a block diagram showing a structural example of a PLL circuit according to a second embodiment of the present invention. The PLL circuit is the same as the PLL circuit 110 in FIG. 1.

FIG. 8B is a circuit diagram showing a structural example of a VCO 104 in FIG. 8A. The VCO 104 is the same as the VCO in FIG. 4.

FIG. 8C is a circuit diagram showing a structural example of a CR ring element 404 in FIG. 8B. A point where the present embodiment is different from FIG. 5 will be explained. An N-channel transistor 801 corresponds to the current source 403 in FIG. 5, and having a gate, a source, and a drain respectively connected to a fixed voltage Vb, a ground, and an interconnection point of sources of the transistors 501*a* and 501*b*. The CR ring element 404 is a CR delay element in which resistors (R) 402*a* and 402*b* are fixed and capacitances (C) 502*a* and 502*b* are variable. The CR ring element 404 has a CML-type differential amplifier, and applies pure resistors 402*a* and 402*b* as loads in which no transistors are used.

As described above, according to the present embodiment, the transistor 801 serves as a current source, which flows a tail current Is of the CML-type differential amplifier. The oscillation is generated by making the gate voltage Vb of the transistor 801 constant, using the pure resistors 402*a* and 402*b* as the loads, and by using a linearity of the C-V characteristic of the variable capacitances 502*a* and 502*b*.

FIG. 9A is a block diagram showing a structural example of a PLL circuit according to a third embodiment of the present invention. The PLL circuit is the same as the PLL circuit in FIG. 8A.

FIG. 9B is a circuit diagram showing a structural example of a VCO 104 in FIG. 9A. The VCO 104 is the same as the VCO in FIG. 8B.

FIG. 9C is a circuit diagram showing a structural example of a CR ring element 404 in FIG. 9B. A point where the present embodiment is different from FIG. 8C will be explained. Load resistor units 901*a* and 901*b* are provided in place of the load resistors 402*a* and 402*b* in FIG. 8C.

FIG. 9D is a view showing a structural example of the respective load resistor units 901*a* and 901*b* in FIG. 9C. The load resistor units 901*a* and 901*b* are composed of P-channel transistors 902. The transistor 902 is connected at a gate thereof to a fixed voltage Vb1, at a source thereof to the power supply voltage, and at a drain thereof to a drain of either the transistor 501*a* or the transistor 501*b*.

FIG. 9E is a view showing another structural example of the respective load resistor units 901*a* and 901*b* in FIG. 9C. The load resistor units 901*a* and 901*b* are composed of P-channel transistors 903. The transistor 903 is diode-connected. Specifically, the transistor 903 is connected at a source thereof to the power supply voltage, and at a gate and a drain thereof to the drain of either the transistor 501*a* or the transistor 501*b*.

FIG. 9F is a view showing still another structural example of the respective load resistor units 901*a* and 901*b* in FIG. 9C. The load resistor units 901*a* and 901*b* are composed of P-channel transistors 904 and 905. The transistor 904 corresponds to the transistor 902 in FIG. 9D. The transistor 905 corresponds to the transistor 903 in FIG. 9E. The transistors 904 and 905 are connected in parallel.

The present embodiment is an example where transistors are applied to the load resistor units 901*a* and 901*b*. FIG. 9D shows a type in which the P-channel transistor 902 is directly biased. FIG. 9E shows a diode-connected type transistor 903 which is made to be strong against a common variation by suppressing some gains. FIG. 9F shows a symmetric load type in which a linearity of the transistor is improved by connecting the bias transistor 904 and the diode-connected transistor 905 in parallel.

FIG. 10A is a block diagram showing a structural example of a PLL circuit according to a fourth embodiment of the present invention. The PLL circuit is the same as the PLL circuit in FIG. 8A.

FIG. 10B is a circuit diagram showing a structural example of a VCO 104 in FIG. 10A. Positions of the load resistors 402 and the current sources 403 in the VCO 104 are opposite to those of the VCO in FIG. 8B. The current sources 403 are connected between the power supply voltage and the differential amplifiers 401. The load resistors 402 are connected between the differential amplifiers 401 and the ground.

FIG. 10C is a circuit diagram showing a structural example of a CR ring element 404 in FIG. 10B. A P-channel transistor 1001 corresponds to the current source 403 in FIG. 10B, and has a gate, a source, and a drain respectively connected to a fixed voltage Vb, the power supply voltage, and an interconnection point of sources of P-channel transistors 1007*a* and 1007*b*. A gate of the P-channel transistor 1007*a* is connected to a non-inverting input terminal I+. A gate of the P-channel transistor 1007*b* is connected to an inverting input terminal I−. The variable capacitance 502*a* is connected between a drain of the transistor 1007*a* and the control voltage Vcntl. The variable capacitance 502*b* is connected between a drain of the transistor 1007*b* and the control voltage Vcntl. A non-inverting output terminal O+ is connected to the drain of the transistor 1007*b*. An inverting output terminal O− is connected to the drain of the transistor 1007*a*. A load resistor unit 1006*a* is connected between the drain of the transistor 1007*a* and the ground. A load resistor unit 1006*b* is connected between the drain of the transistor 1007*b* and the ground. The load resistor units 1006*a* and 1006*b* correspond to the load resistors 402 in FIG. 10B.

FIG. 10D is a view showing a structural example of the respective load resistor units 1006*a* and 1006*b* in FIG. 10C. The load resistor units 1006*a* and 1006*b* are composed of N-channel transistors 1002. The transistor 1002 is connected at a gate thereof to a fixed voltage Vb1, at a source thereof to the ground, and at a drain thereof to the drain of either the transistor 1007*a* or the transistor 1007*b*.

Figure 10E:
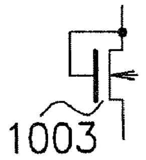
FIG. 10E is a view showing another structural example of the load resistor unit in FIG. 10C.

FIG. 10E is a view showing another structural example of the respective load resistor units 1006*a* and 1006*b* in FIG. 10C. The load resistor units 1006*a* and 1006*b* are composed of N-channel transistors 1003. The transistor 1003 is diode-connected. Specifically, the transistor 1003 is connected at a source thereof to the ground, and at a gate and a drain thereof to the drain of either the transistor 1007*a* or the transistor 1007*b*.

Figure 10F:
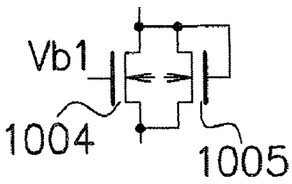
FIG. 10F is a view showing still another structural example of the load resistor unit in FIG. 10C.

FIG. 10F is a view showing still another structural example of the respective load resistor units 1006*a* and 1006*b* in FIG. 10C. The load resistor units 1006*a* and 1006*b* are composed of N-channel transistors 1004 and 1005. The transistor 1004 corresponds to the transistor 1002 in FIG. 10D. The transistor 1005 corresponds to the transistor 1003 in FIG. 10E. The transistors 1004 and 1005 are connected in parallel.

The present embodiment shows an example where the tail current Is is introduced from the power supply voltage side, being different from FIG. 9C. Since this circuit is mainly composed of the P-channel transistor, compared to the circuit structure in FIG. 9C, it has a demerit in lowering the band, but, it has also a merit in exhibiting a good 1/f noise characteristic.

Figure 11A:
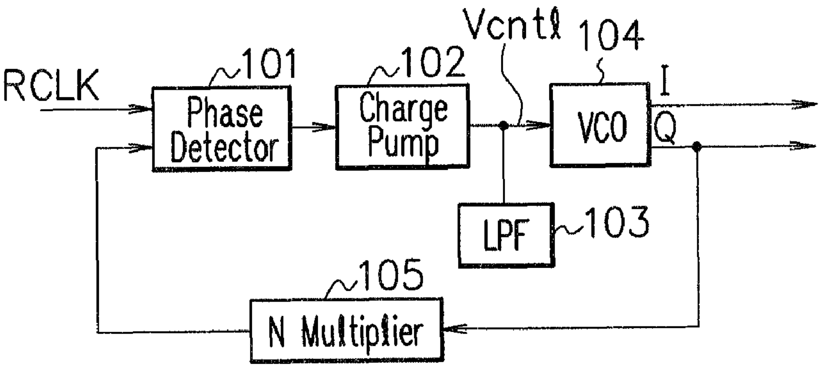
FIG. 11A is a block diagram showing a structural example of a PLL circuit according to a fifth embodiment of the present invention.

FIG. 11A is a block diagram showing a structural example of a PLL circuit according to a fifth embodiment of the present invention. The PLL circuit is the same as the PLL circuit in FIG. 8A.

FIG. 11B is a circuit diagram showing a structural example of a VCO 104 in FIG. 11A. The VCO 104 is the same as the VCO in FIG. 8B.

FIG. 11C is a circuit diagram showing a structural example of a CR ring element 404 in FIG. 11B. A point where the present embodiment is different from FIG. 8C will be explained. Load resistor units 1103*a* and 1103*b* are variable resistors, and are provided in place of the load resistors 402*a* and 402*b* in FIG. 8C. A tail current source 1104 is a variable current source, and is provided instead of the transistor 801 in FIG. 8C.

FIG. 11D is a view showing a structural example of the respective load resistor units 1103*a* and 1103*b* in FIG. 11C. Sources and drains of a plurality of P-channel transistors 1101 are respectively connected in parallel. The transistors 1101 are connected to the power supply voltage at an interconnection point of the sources thereof, and connected to the drain of either the transistor 501*a* or the transistor 501*b* at an interconnection point of the drains thereof. A voltage is supplied from the outside to gates of the plurality of transistors 1101. Resistance values of the load resistor units 1103*a* and 1103*b* can be varied by weighting the plurality of transistors 1101, and by controlling the respective gate voltages individually from the outside.

FIG. 11E is a view showing a structural example of the tail current source 1104 in FIG. 11C. Sources and drains of a plurality of N-channel transistors 1102 are respectively connected in parallel. The transistors 1102 are connected to the ground at an interconnection point of the sources thereof, and to the source of either the transistor 501*a* or the transistor 501*b* at an interconnection point of the drains thereof. A voltage is supplied from the outside to gates of the plurality of transistors 1102. A current amount of the tail current source 1104 can be varied by weighting the plurality of transistors 1102, and by controlling the respective gate voltages individually from the outside.

According to the present embodiment, an offset frequency can be controlled. By making the resistance values of the load resistor units 1103*a* and 1103*b* variable from the outside, it becomes possible to change a center oscillation frequency of the VCO 104. In order not to change an operating point, the current amount of the tail current source 1104 can also be variable in addition to the load resistor units 1103*a* and 1103*b*.

The variable capacitances 502*a* and 502*b* are controlled by the control voltage Vcntl. On the other hand, the transistors 1101 of the load resistor units 1103*a* and 1103*b*, and the gates of the transistors 1102 of the current source 1104 are controlled by a voltage independent from the control voltage Vcntl. In an operation preparation stage of the PLL circuit, the load resistor units 1103*a* and 1103*b* and the tail current source 1104 are controlled from the outside, to thereby determine the center oscillation frequency of the VCO 104. During the operation of the PLL circuit, only the variable capacitances 502*a* and 502*b* are controlled by the control voltage Vcntl being fed back, to thereby determine the oscillation frequency. Note that the gates of the transistors 1102 of the current source 1104 can be controlled by the control voltage Vcntl.

As described above, by connecting the transistors 1102 of the tail current source 1104 in parallel, the current value of the current source 1104 can be variable from the outside. Further, by connecting the transistors 1101 of the load resistor units 1103*a* and 1103*b* in parallel, on-resistances of the transistors 1101 can be variable. These controls enable the VCO 104 to freely select the offset frequency.

FIG. 12A is a block diagram showing a structural example of a PLL circuit according to a sixth embodiment of the present invention. The PLL circuit is the same as the PLL circuit in FIG. 8A.

FIG. 12B is a circuit diagram showing a structural example of a VCO 104 in FIG. 12A. The VCO 104 is the same as the VCO in FIG. 8B.

FIG. 12C is a circuit diagram showing a structural example of a CR ring element 404 in FIG. 12B. A point where the present embodiment is different from FIG. 9C will be explained. An offset capacitance 1201*a* is connected in parallel with the variable capacitance 502*a*, and an offset capacitance 1201*b* is connected in parallel with the variable capacitance 502*b*. The tail current source 403 corresponds to the transistor 801 in FIG. 9C.

FIG. 12D is a view showing a structural example of the respective offset capacitances 1201*a* and 1201*b* in FIG. 12C. A plurality of variable capacitances 1202 are connected in parallel. The capacitance 1202 may have a capacitance value controlled by a voltage independent from the control voltage Vcntl, or it may be a fixed capacitance.

FIG. 12E is a view showing another structural example of the respective offset capacitances 1201*a* and 1201*b* in FIG. 12C. Sources and drains of a plurality of P-channel transistors 1203 are respectively connected in parallel with either the variable capacitance 502*a* or the variable capacitance 502*b*. An external voltage independent from the control voltage Vcntl is supplied to gates of the plurality of transistors 1203. Capacitance values between the sources and the drains of the transistors 1203 can be varied by weighting the plurality of transistors 1203, and by controlling the respective gate voltages individually from the outside.

According to the present embodiment, an offset frequency can be controlled. By making the capacitance values of the offset capacitances 1201*a* and 1201*b* variable from the outside, it becomes possible to change a center oscillation frequency of the VCO 104.

As described above, by connecting the offset capacitances 1201*a* and 1201*b* in parallel with the variable capacitances 502*a* and 502*b* capable of being controlled in an analog way, it is possible to freely select the offset frequency. The offset capacitances 1201*a* and 1201*b* may be varactor elements, other than the analog capacitance elements and the transistors.

According to the fifth and sixth embodiments, it is possible to easily change the center oscillation frequency. Depending on the specifications of the PLL circuit, the usage in which the center oscillation frequency of the VCO is changed is conceivable. As a method for changing the center oscillation frequency, to vary the on-resistances as in the fifth embodiment or to add capacitances as offset capacitances as in the sixth embodiment, can be mentioned. To make the on-resistance variable, it is only needed to connect the transistors 1101 of the load resistor units 1103*a* and 1103*b* in parallel with each other. In this case, if the current of the tail current source 1104 is also controlled in accordance with the resistance values of the load resistor units 1103*a* and 1103*b*, a stable operation can be generally realized, since the operating point does not change. Specifically, the on/off of the transistors 1101 of the load resistor units 1103*a* and 1103*b* is controlled so that the current being half of the tail current flows through the respective load resistor units 1103*a* and 1103*b*. Further, the center frequency can also be changed by connecting the offset capacitances 1201*a* and 1201*b* in parallel with the variable capacitances 502*a* and 502*b*. There is no problem that the offset capacitances 1201*a* and 1201*b* are capacitance elements using MOS structures, capacitances using varactors or wires, or the like, other than the analog capacitance elements.

FIG. 13 is a block diagram showing a structural example of a PLL circuit according to a seventh embodiment of the present invention. A point where this PLL circuit is different from the PLL circuit in FIG. 8A will be explained. In FIG. 8A, the VCO 104 generates the differential signals to output. On the other hand, in FIG. 13, the VCO 104 generates a single-phase signal PCLK to output.

FIG. 2 is a circuit diagram showing a structural example of the VCO 104 in FIG. 13. The VCO 104 is a voltage controlled ring oscillator. A plurality of odd number of inverters (amplifiers) 201 are ring-connected. The inverter 201 inverts an input signal by 180°, and amplifies it to output. A plurality of variable capacitances 202 are respectively connected between outputs of the plurality of inverters 201 and the control voltage Vcntl. The variable capacitance 202 has the same structure as that in FIG. 3, and a capacitance value thereof varies in accordance with the control voltage Vcntl. Since the inverter 201 has the on-resistance of the transistor, the VCO 104 has a CR ring element. As same as the first to sixth embodiments, by varying the variable capacitances 202, the oscillation frequency can be controlled.

The present embodiment shows a voltage controlled ring oscillator which applies positive feedback by connecting an odd number of stages of inverters 201. By connecting the variable capacitances (varactor elements) 202 formed on a semiconductor chip to the outputs of the respective inverters 201, the influence of the threshold voltage Vth can be eliminated, and the tuning voltage range can be enlarged.

As described above, according to the first to seventh embodiments, in the voltage controlled ring oscillator, the tuning voltage range of the VCO can be enlarged without being affected by the threshold voltage Vth. By covering the oscillation frequency range which meets the specifications with the variable range of the variable capacitances, the gain of the VCO can be sufficiently lowered, and the PLL circuit with small jitter can be structured.

Further, during the operation with low power supply voltage of the PLL circuit, the tuning voltage range can be secured without being affected by the threshold voltage Vth. The PLL circuit can operate in the process of the characteristic TYP until the voltage reaches the low power supply voltage of 0.6V, which is confirmed in a simulation.

Further, the circuit structure becomes hard to be affected by the process variation, so that the gain of the VCO can be suppressed at 2/1 or lower of that of the circuit in FIG. 14B, which enables the circuit to be strong against the power supply voltage variation, and to reduce the noise.

Further, when viewed from the PLL circuit, to reduce the gain of the VCO to half means that the capacitance of the LPF 103 is allowed to be half in the same loop parameter, so that the area used by the PLL circuit also becomes 2/1 (half).

Note that the present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

INDUSTRIAL APPLICABILITY

An oscillation frequency can be controlled without being affected by a threshold voltage of a transistor by voltage-controlling a capacitance of a variable capacitance element. Accordingly, a wide range of voltage control can be conducted, resulting that a stable oscillation can be performed even in a case where a power supply voltage is lowered. Further, since being hard to be affected by a process variation, the oscillation can be performed stably. Furthermore, a gain can be reduced, so that a noise can be lowered.

What is claimed is:

1. A phased locked loop circuit, comprising:

a phase detector to compare a feedback clock signal with a reference clock signal and to output a difference signal;

a charge pump to output a signal based on the difference signal;

a filter to smooth the signal and to output a voltage control signal; and a voltage controlled ring oscillator to output a clock signal corresponding to the feedback clock signal based on the voltage control signal, wherein the voltage controlled ring oscillator includes:

a plurality of Current Mode Logic type (CML-type) differential amplifiers which are ring-connected; and a plurality of variable capacitance elements being respectively connected to said plurality of amplifiers and having capacitances varied by the voltage control signal, a plurality of load resistors respectively connected to said plurality of amplifiers;

a plurality of tail current sources respectively connected to said plurality of amplifiers; and a plurality of offset capacitance elements respectively connected in parallel with said plurality of variable capacitance elements, a capacitance of each of the plurality of offset capacitance elements being capable of being variable-controlled independent from said variable capacitance.

2. The phased locked loop circuit according to claim 1, wherein each of the plurality of current sources is a constant current source, and each of the plurality of load resistors is a fixed resistor.

3. The phased locked loop circuit according to claim 2, wherein each of the plurality of load resistors is a pure resistor in which no transistor is used.

4. The phased locked loop circuit according to claim 2, wherein a P-channel field-effect transistor is used as each of the plurality of load resistors.

5. The phased locked loop circuit according to claim 2, wherein an N-channel field-effect transistor is used as each of the plurality of load resistors.

6. The phased locked loop circuit according to claim 1, wherein each of the plurality of tail current sources is a variable current source, or each of the plurality of load resistors is a variable resistor.

7. The phased locked loop circuit according to claim 1, wherein said plurality of amplifiers are an odd number of inverters, and said plurality of variable capacitance elements are respectively connected to outputs of the plurality of inverters.

8. The phased locked loop circuit according to claim 1, wherein a field-effect transistor is used as each of the plurality of tail current sources.

9. The phased locked loop circuit according to claim 4, wherein each of the plurality of load resistors is a P-channel field-effect transistor whose gate voltage is constant, a diode-connected P-channel field-effect transistor, or one in which the P-channel field-effect transistor whose gate voltage is constant and the diode-connected P-channel field-effect transistor are parallel-connected.

10. The phased locked loop circuit according to claim 9, wherein an N-channel field-effect transistor is used as each of the plurality of tail current sources.

11. The phased locked loop circuit according to claim 5, wherein each of the plurality of load resistors is an N-channel field-effect transistor whose gate voltage is constant, a diode-connected N-channel field-effect transistor, or one in which the N-channel field-effect transistor whose gate voltage is constant and the diode-connected N-channel field-effect transistor are parallel-connected.

12. The phased locked loop circuit according to claim 11, wherein a P-channel field-effect transistor is used as each of the plurality of tail current sources.

13. The phased locked loop circuit according to claim 6, wherein a current of each of the plurality of tail current sources is capable of being variable-controlled independent from said variable capacitance, and each of the plurality of tail current sources includes a plurality of parallel-connected field-effect transistors.

14. The phased locked loop circuit according to claim 6, wherein a resistance of each of the plurality of load resistors is capable of being variable-controlled independent from said variable capacitance, and each of the plurality of load resistors includes a plurality of parallel-connected field-effect transistors.

15. The phased locked loop circuit according to claim 1, wherein each of the plurality of offset capacitance elements includes a plurality of parallel-connected field-effect transistors.

16. The phased locked loop circuit according to claim 1, wherein each of the plurality of variable capacitances is formed on a semiconductor chip.

* * * * *